United States Patent
Son et al.

(10) Patent No.: US 12,508,633 B2
(45) Date of Patent: Dec. 30, 2025

(54) MOVING ASSEMBLY FOR RECOVERY GUARD AND SUBSTRATE PROCESSING APPARATUS

(71) Applicant: SEMES CO., LTD., Chungcheongnam-do (KR)

(72) Inventors: Won Sik Son, Chungcheongnam-do (KR); Sae Hoon Han, Chungcheongnam-do (KR); In Ki Jung, Chungcheongnam-do (KR); Se Hoon Oh, Chungcheongnam-do (KR); Hyeon Jun Lee, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 361 days.

(21) Appl. No.: 18/201,985

(22) Filed: May 25, 2023

(65) Prior Publication Data

US 2023/0405649 A1  Dec. 21, 2023

(30) Foreign Application Priority Data

Jun. 16, 2022 (KR) .................. 10-2022-0073712

(51) Int. Cl.
  *B08B 13/00* (2006.01)
  *B08B 3/04* (2006.01)
(52) U.S. Cl.
  CPC ............. *B08B 13/00* (2013.01); *B08B 3/04* (2013.01)
(58) Field of Classification Search
  CPC .................................. B08B 13/00; B08B 3/04
  See application file for complete search history.

(56) References Cited

U.S. PATENT DOCUMENTS

| 8,881,751 B2 * | 11/2014 | Ogata ............. H01L 21/67051 134/182 |
| 9,922,850 B2 * | 3/2018 | Kwon ............. H01L 21/67051 |
| 2006/0222315 A1 * | 10/2006 | Yoshida ........... H01L 21/67051 385/147 |

(Continued)

FOREIGN PATENT DOCUMENTS

| JP | 2004111487 A * | 4/2004 |
| JP | 2004153078 A * | 5/2004 |

(Continued)

*Primary Examiner* — Benjamin L Osterhout
(74) *Attorney, Agent, or Firm* — WOMBLE BOND DICKINSON (US) LLP

(57) ABSTRACT

The moving assembly for a recovery guard includes a recovery vessel, including a first recovery vessel surrounding a substrate support, a second recovery vessel, and a lifting driver connected to the first and second recovery vessels and elevating the first and second recovery vessels. The lifting driver includes a first motor and a second motor, a first shaft connected to the first motor and the first recovery vessel and moving in a first direction by driving the first motor, a second shaft connected to the second motor and the second recovery vessel and moving in the first direction by driving the second motor, a first connecting portion connecting the first shaft and the first recovery vessel, and a second connecting portion connecting the second shaft and the second recovery vessel, the second connecting portion including a passage hole through which the first shaft passes.

20 Claims, 12 Drawing Sheets

(56) References Cited

U.S. PATENT DOCUMENTS

| | | | |
|---|---|---|---|
| 2008/0078428 A1* | 4/2008 | Yoshida | H01L 21/67051 |
| | | | 134/104.2 |
| 2017/0232485 A1 | 8/2017 | Hashimoto | |
| 2018/0085795 A1* | 3/2018 | Tsuchihashi | H01L 21/67023 |

FOREIGN PATENT DOCUMENTS

| | | | | | |
|---|---|---|---|---|---|
| JP | 2004172204 | A | * | 6/2004 | |
| JP | 2004172558 | A | * | 6/2004 | |
| JP | 2004296610 | A | * | 10/2004 | ....... H01L 21/67051 |
| JP | 3781983 | B2 | * | 6/2006 | |
| JP | 2006286833 | A | * | 10/2006 | |
| JP | 2007180268 | A | * | 7/2007 | |
| KR | 10-2004-0006115 | | | 1/2004 | |
| KR | 20080021110 | A | * | 3/2008 | ........... C01B 33/037 |
| KR | 10-1909185 | | | 10/2018 | |
| KR | 10-2007558 | | | 8/2019 | |
| KR | 10-2021-0055088 | | | 5/2021 | |
| KR | 10-2022-0015668 | | | 2/2022 | |
| TW | 201125062 | A | * | 7/2011 | ....... H01L 21/67017 |
| TW | I718477 | B | * | 2/2021 | ....... H01L 21/02312 |
| WO | 2020/068343 | | | 4/2020 | |

* cited by examiner

MOVING ASSEMBLY FOR RECOVERY GUARD AND SUBSTRATE PROCESSING APPARATUS

CROSS-REFERENCE TO RELATED APPLICATION(S)

This application claims benefit of priority to Korean Patent Application No. 10-2022-0073712 filed on Jun. 16, 2022 in the Korean Intellectual Property Office, the disclosure of which is incorporated herein by reference in its entirety.

BACKGROUND

1. Field

The present disclosure relates to a moving assembly for a recovery guard used in a substrate processing apparatus for supplying and recovering a processing liquid, and more particularly, to a moving assembly for a recovery guard for adjusting a height of the recovery vessel for recovering a treatment liquid and a substrate processing method.

2. Description of Related Art

A semiconductor (or display) manufacturing process is a process for manufacturing a semiconductor device on a substrate (e.g., wafer), and includes, for example, exposure, deposition, etching, ion implantation, cleaning, and the like. In detail, various organic and inorganic foreign substances are present on the substrate. Therefore, in order to improve manufacturing yield, it is significantly important to effectively remove foreign substances on the substrate.

A cleaning process using a treatment liquid (a cleaning liquid) is mainly used to remove foreign substances. The cleaning process may be performed by supplying a treatment liquid to the upper or rear surface of the substrate while rotating a spin chuck supporting the substrate, and after the cleaning process, a rinsing process using a rinsing liquid and a drying process using drying gas are performed.

On the other hand, it is necessary to recover the treatment liquid supplied to the substrate, for discharge or reuse. To recover the treatment liquid scattered from the substrate, a recovery vessel (a cup or bowl) formed around the substrate may be provided. In order to effectively recover the treatment liquid, the recovery vessel moves up and down to a higher position than the position of the substrate according to the supply timing of the treatment liquid. Equipment as in Patent Documents 1 and 2 is known as a substrate processing apparatus including a configuration for adjusting the height of a recovery vessel.

On the other hand, in order to increase the efficiency of the substrate processing process, the smaller the substrate processing apparatus is, the more advantageous it is. As the device is reduced in size, the configuration for adjusting the height of the recovery vessel also needs to be reduced accordingly. However, Patent Document 1 has a limitation that the height of the device is increased by the combination of a cylinder and a motor, and the lifting and lowering by the cylinder does not ensure uniformity of lifting and lowering. In the case of Patent Document 2, there is a limitation that it is not suitable for miniaturized equipment by matching individual recovery vessels to individual processing containers.

SUMMARY

An aspect of the present disclosure is to provide a moving assembly for a recovery guard and a substrate processing apparatus, which may be installed in a relatively narrow space and are easily controlled.

According to an aspect of the present disclosure, a moving assembly for a recovery guard and a substrate processing apparatus are provided as follows.

According to an aspect of the present disclosure, a moving assembly for a recovery guard includes a recovery vessel, including a first recovery vessel surrounding a substrate support, and a second recovery vessel disposed inside of the first recovery vessel, concentrically with respect to the first recovery vessel; and a lifting driver connected to the first and second recovery vessels and elevating the first and second recovery vessels. The lifting driver includes a first motor and a second motor, a first shaft connected to the first motor and the first recovery vessel and moving in a first direction by driving the first motor, a second shaft connected to the second motor and the second recovery vessel and moving in the first direction by driving the second motor, a first connecting portion connecting the first shaft and the first recovery vessel, and a second connecting portion connecting the second shaft and the second recovery vessel, the second connecting portion including a passage hole through which the first shaft passes.

According to an aspect of the present disclosure, a moving assembly for a recovery guard includes a recovery vessel including a first recovery vessel surrounding a substrate support and a second recovery vessel disposed inside of the first recovery vessel and having the same center line as a center line of the first recovery vessel; and a lifting driver connected to the first and second recovery vessels and elevating the first and second recovery vessels. The lifting driver includes a first motor and a second motor disposed adjacent to each other, a first shaft connected to the first motor and the first recovery vessel and moving in a first direction by driving the first motor, a second shaft connected to the second motor and the second recovery vessel and moving in the first direction by driving the second motor, a first connecting portion connecting the first shaft and the first recovery vessel, and a second connecting portion connecting the second shaft and the second recovery vessel at the same azimuthal angle as a first housing from the center line, and the lifting driver includes a first lifting driver disposed on one side of the first and second recovery vessels and a second lifting driver disposed in a position symmetrical to the first lifting driver with respect to the center line.

According to an aspect of the present disclosure, a substrate processing apparatus includes a substrate support rotating while supporting a substrate; a treatment liquid supply unit supplying a treatment liquid to the substrate; and a moving assembly for a recovery guard, including a recovery vessel recovering the treatment liquid scattered from the substrate, and a lifting driver connected to the recovery vessel and elevating the recovery vessel. The recovery vessel includes a first recovery vessel surrounding the substrate support, a second recovery vessel disposed inside of the first recovery vessel concentrically with respect to the first recovery vessel, a third recovery vessel disposed inside of the second recovery vessel concentrically with respect to the first recovery vessel, and a fourth recovery vessel disposed inside of the third recovery vessel concentrically with respect to the first recovery vessel. The lifting driver includes a first lifting driver connected to the first and second recovery vessels, a second lifting driver disposed in a position symmetrical to a center line of the first lifting driver and the recovery vessel on a plane and connected to the first and second recovery vessels, a third lifting driver connected to the third and fourth recovery vessels, and a fourth lifting driver disposed in a position symmetrical to a center line of the third lifting driver and the recovery vessel, and connected to the third and fourth recovery vessels. The first to fourth lifting drivers respectively include first and second motors disposed adjacently to each other, a first shaft connected to the first motor and the first recovery vessel and moving in a first direction by driving the first motor, a second shaft connected to the second motor and the second recovery vessel and moving in the first direction by driving the second motor, a first connecting portion connecting the first shaft and the first recovery vessel, and a second connecting portion connecting the second shaft and the second recovery vessel at the same azimuthal angle as a first housing from the center line.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
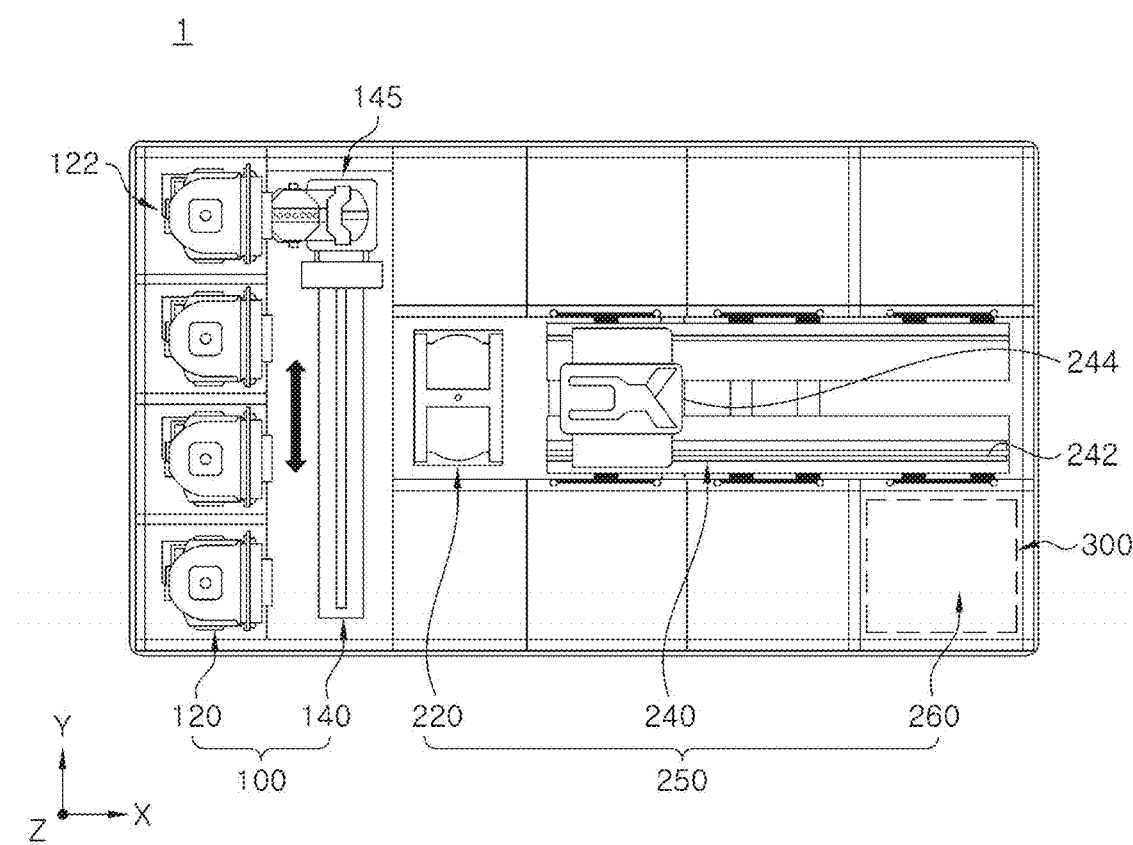
FIG. 1 is a plan view schematically illustrating a substrate processing apparatus according to an embodiment.

Hereinafter, embodiments will be described in detail such that those skilled in the art may easily practice the present disclosure with reference to the accompanying drawings. However, in describing a preferred embodiment in detail, if it is determined that a detailed description of a related known function or configuration may unnecessarily obscure the gist of the present disclosure, the detailed description will be omitted. In addition, the same reference numerals are used throughout the drawings for parts having similar functions and actions. In addition, in the present specification, terms such as 'on,' 'upper portion,' 'upper surface,' 'below,' 'lower portion,' 'lower surface,' 'side' and the like are based on the drawings, and may be changed depending on the direction in which components are actually disposed.

In addition, throughout the specification, when a portion is said to be 'connected' to another part, it is not only 'directly connected,' but also 'indirectly connected' with other components therebetween. Further, 'including' a certain component means that other components may be further included, rather than excluding other components unless otherwise stated.

The present disclosure may be embodied in many different forms and is not limited to the embodiments set forth herein.

FIG. 1 is a plan view schematically illustrating a substrate processing apparatus according to an embodiment. Referring to FIG. 1, a substrate processing apparatus 1 includes an index unit 100 and a process processing unit 200.

The index unit 100 may include a load port 120 and an index chamber 140. The load port 120, the index chamber 140, and the processing unit 250 may be sequentially arranged in a line. Hereinafter, the direction in which the load port 120, the index chamber 140, and the processing unit 250 are arranged is referred to as a first direction X. When viewed from above, a direction perpendicular to the first direction X is referred to as a second direction (Y), and a direction perpendicular to the plane including the first direction X and the second direction (Y) is referred to as a third direction (Z).

A carrier 122 in which a substrate is accommodated is seated in the load port 120. The load port 120 may be provided as a plurality of load ports, and the plurality of load ports may be disposed in a line in the second direction (Y). Although FIG. 1 illustrates that four load ports 120 are provided, the number of load ports 120 may be increased or decreased according to conditions such as process efficiency and footprint of the process unit 250. A front opening unified pod (FOUP) may be used as the carrier 122.

The index chamber 140 is located between the load port 120 and the processing unit 250. The index chamber 140 has a rectangular parallelepiped shape including a front panel, a rear panel, and both side panels, and includes an index robot 145 for transferring substrates between the carrier 122 seated in the load port 120 and the load lock chamber 220 is provided therein. Although not illustrated, the index chamber 140 may include a controlled air flow system such as vents or a laminar flow system to prevent particles from entering the internal space.

The processing unit 250 may include a load lock chamber 220, a transfer chamber 240, and a liquid processing chamber 260. The transfer chamber 240 may be disposed in such a manner that the length thereof is parallel to the first direction X. Liquid processing chambers 260 may be disposed on one side and the other side of the transfer chamber 240 in the second direction Y, respectively.

A portion of the liquid processing chambers 260 may be disposed in the length direction of the transfer chamber 240. Also, some of the liquid processing chambers 260 may be stacked with each other.

For example, on one side of the transfer chamber 240, the liquid processing chambers 260 may be disposed in an array of A×B (where A and B are each an integer greater than or equal to 1). In this case, A is the number of liquid processing chambers 260 provided in a row in the first direction X, and B is the number of liquid processing chambers 260 provided in a row in the third direction Y. In the substrate processing apparatus 1, as the numbers of A and B increase, the number of liquid processing chambers 260 in one substrate processing apparatus 1 increases, and accordingly, relatively many substrates may be processed with one apparatus. However, increasing the number of A and B in a given space means that respective liquid processing chambers 260 are reduced in size, and it is possible to disposed a relatively large number of liquid processing chambers 260 in one substrate processing apparatus 1 only when the installation space of peripheral devices is reduced while the size of the substrate is the same.

The load lock chamber 220 is disposed between the index chamber 140 and the transfer chamber 240. The load lock chamber 220 provides a space for temporarily loading a substrate before transferring the substrate between the transfer chamber 240 and the index chamber 140. The load lock chamber 220 is provided with a slot (not illustrated) in which a substrate is disposed, and the slot is provided as a plurality of slots spaced apart from each other in the third direction Z. In the loadlock chamber 220, a surface facing the index chamber 140 and a surface facing the transfer chamber 240 may be respectively provided in an open form.

The transfer chamber 240 may transfer substrates between the load lock chamber 220 and the liquid processing chambers 260. A guide rail 242 and a main robot 244 may be provided in the transfer chamber 240. The guide rail 242 is disposed such that a longitudinal direction thereof is parallel to the first direction X. The main robot 244 is installed on the guide rail 242 and is provided to be able to move linearly in the first direction X on the guide rail 242.

A substrate processing apparatus 300 may be provided in the liquid processing chamber 260 to perform a liquid processing process on a substrate, for example, a cleaning process. For example, the cleaning process may be a process of cleaning a substrate, stripping, or removing organic residues using processing fluids containing an alcohol component. The substrate processing apparatus provided in each liquid processing chamber 260 may have a different structure depending on the type of cleaning process to be performed. Optionally, substrate processing apparatuses in respect liquid processing chambers 260 may have the same structure. Optionally, the liquid processing chambers 260 are divided into a plurality of groups, and the substrate processing apparatuses in the liquid processing chambers 260 belonging to the same group have the same structure, and substrate processing apparatuses provided in the liquid processing chambers 260 belonging to different groups may have structures different from each other. Hereinafter, an example of a substrate processing apparatus provided in the liquid processing chamber 260 will be described.

Figure 2:
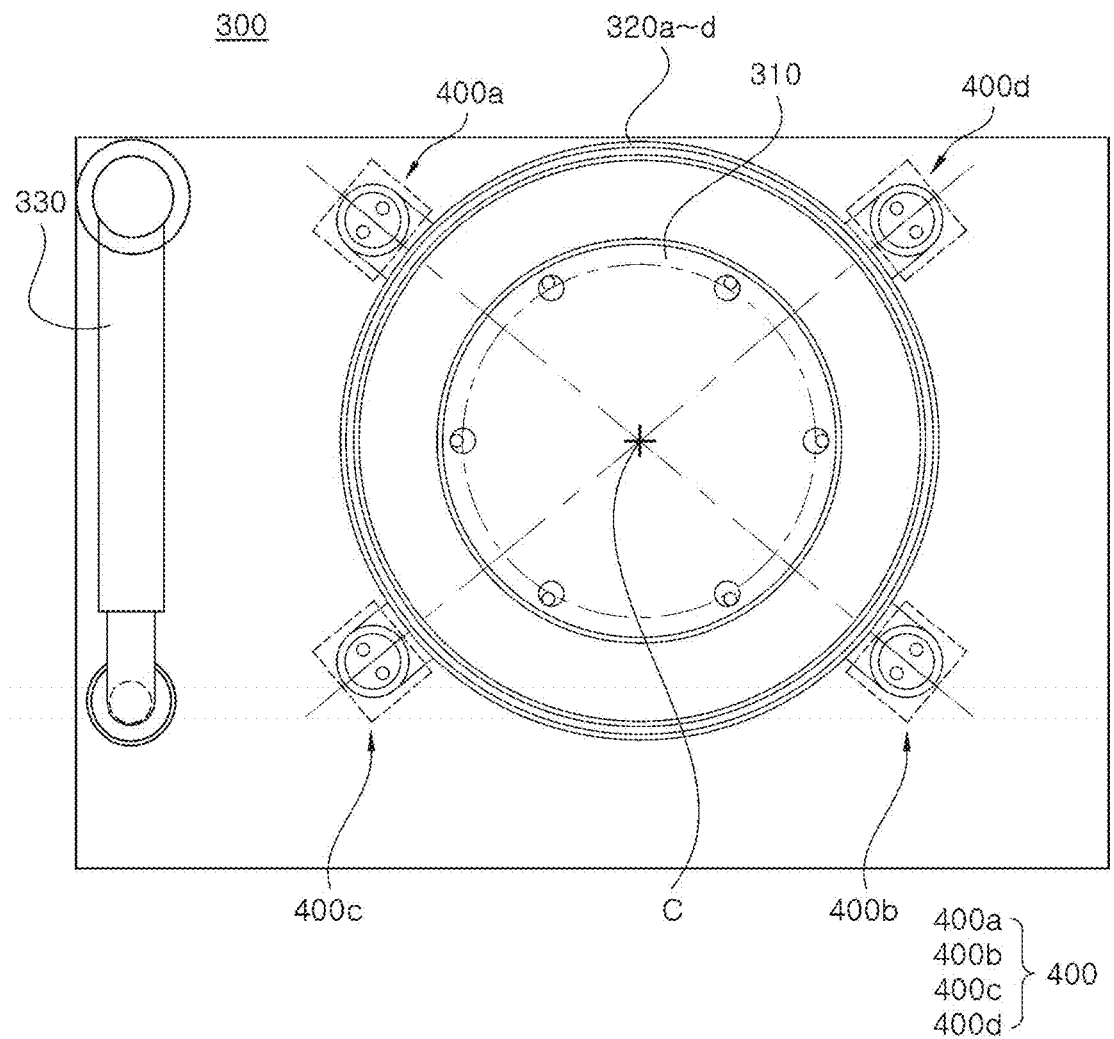
FIG. 2 is a schematic plan view of a substrate processing apparatus provided in a chamber for processing a substrate according to an embodiment.

FIG. 2 is a schematic diagram of the substrate processing apparatus 300 disposed in a liquid processing chamber 260 according to an embodiment. Referring to FIG. 2, the substrate processing apparatus 300 includes a substrate support 310 for supporting a substrate, a treatment liquid supply unit 330 for supplying a processing liquid to the substrate, and a liquid chemical recovery unit for recovering the processing liquid scattered from the substrate. The liquid chemical recovery unit may include a plurality of (e.g., four) recovery vessels 320*a-d* and a moving assembly for a recovery guard for elevating the recovery vessels 320*a-d*.

The substrate support 310 supports and rotates the substrate during the process. The substrate support 310 may include a support plate, a support pin, a chuck pin, and a rotation driving member. The support plate is provided in a substantially circular plate shape. The support pin is provided as a plurality of support pins protruding upward from the support plate to support the rear surface of the substrate.

The chuck pin is provided as a plurality of chuck pins protruding upward from the support plate to support the side of the substrate. The chuck pin supports the side of the substrate such that the substrate is not laterally displaced from the original position when the support plate is rotated. The chuck pin is provided to enable linear movement between an outer position and an inner position in the radial direction of the support plate. When the substrate is loaded or unloaded from the support plate, the chuck pin is located at an outer position, and when a process is performed on the substrate, the chuck pin is located at an inner position. The inner position is a position in which the side of the substrate and the chuck pin are in contact with each other, and the outer position is a position in which the chuck pin and the substrate are spaced apart from each other.

The rotation driving member rotates the support plate. The support plate is rotatable around a central axis by the rotation driving member. The rotation driving member includes a support shaft and a driving unit. The support shaft may have a tubular shape. An upper end of the support shaft may be fixedly coupled to a lower surface of the support plate. The driving unit provides a driving force such that the support shaft rotates. The support shaft is rotated by the driving unit, and the support plate may be rotated together with the support shaft.

The moving assembly for a recovery guard includes recovery vessels 320*a-d* and a lifting driver 400 that linearly moves the recovery vessels 320*a-d* in a third direction (Z), and as the recovery vessels 320*a-d* move up and down, the relative heights of the recovery vessels 320*a-d* with respect to the support plate are changed. The moving assembly for a recovery guard lowers the recovery vessels 320*a-d* by the lifting driver 400 such that the support plate protrudes upwardly of the recovery vessels 320*a-d* when the substrate is loaded onto or unloaded from the support plate. In addition, when the process is in progress, the heights of the recovery vessels 320*a-d* are adjusted such that the treatment liquid flows into the predetermined recovery vessels 320*a-d* according to the type of the treatment liquid supplied to the substrate.

In the moving assembly for a recovery guard, the lifting driver 400 is disposed in a set of two at symmetrical positions with respect to the center line of the substrate, for example, the center line C of the substrate support 310, and the lifting driver 400 is respectively connected to the plurality of recovery vessels 320*a-d*. For example, the first and second recovery vessels 320*a* and 320*b* are connected to the first and second lifting drivers 400*a* and 400*b*, and the third and fourth recovery vessels 320*c* and 320*d* are connected to the third and fourth lifting drivers 400*c* and 400*d*. The first and second lifting drivers 400*a* and 400*b* are disposed in symmetrical positions about the center line C.

The treatment liquid supply unit 330 supplies the treatment liquid to the substrate. The treatment liquid supply unit 330 is provided as a plurality of treatment liquid supply units 330, which may respectively supply different types of treatment liquids. The treatment liquid supply unit 330 may include a moving member and a nozzle. The moving member moves the nozzle to a process position and a stand-by position. In this case, the process position may be a position in which the nozzle faces the substrate supported by the substrate support 310, and the standby position may be a position in which the nozzle is out of the process position.

The moving member moving the nozzle of the treatment liquid supply unit 330 may include a support shaft, an arm, and a driver. The support shaft is located on one side within the chamber. The support shaft may have a rod shape extending in a vertical direction. The support shaft is provided to be rotatable by a driver. The support shaft may be provided to be able to move up and down. The arm is coupled to an upper end of the support shaft and may extend vertically from the support shaft. A nozzle is fixedly coupled to the end of the arm. As the support shaft rotates, the nozzle may swing along with the arm. The nozzle may be swing-moved to a process position and a stand-by position. Optionally, the arm may be provided for forward and backward movement in the longitudinal direction thereof. When viewed from above, the path along which the nozzle is moved may coincide with the center line (C) of the substrate in the process position.

In the present disclosure, the number of recovery vessels 320a-d is not limited to four, and two or more are sufficient. The lifting driver 400 has a configuration capable of operating the plurality of recovery vessels 320a-d with one driver 400, and operates the plurality of recovery vessels 320a-d in one position, to reduce the space occupied by the substrate processing apparatus 300.

In a limited space of the substrate processing apparatus 300, it is necessary to implement accurate lifting and lowering of the recovery vessels 320a-d. In the case of Patent Document 1, since the lifting and lowering of the recovery vessels 320a-d are implemented by an air cylinder and since the speed of raising the recovery vessels 320a-d on both sides is not the same, the recovery vessels 320a-d may be temporarily inclined, and as a result, foreign substances or device damage due to abrasion may occur. In addition, in the case of the air cylinder, the lifting width is limited, and thus, when the rotational speed of the substrate support 310 changes, an additional motor is disposed below the air cylinder to correspond to the rotational speed. In the case of an additional motor, it is necessary to secure an additional space within the substrate processing apparatus 300, and as a result, there is a limitation that the substrate processing apparatus 300 becomes large. The present disclosure provides a moving assembly for a recovery guard including a lifting driver 400, in which the size of the substrate processing apparatus 300 is reduced and the recovery vessels 320a-d may stably move and respond to rotational speeds, and a substrate processing apparatus 300 including the same.

Figure 3:
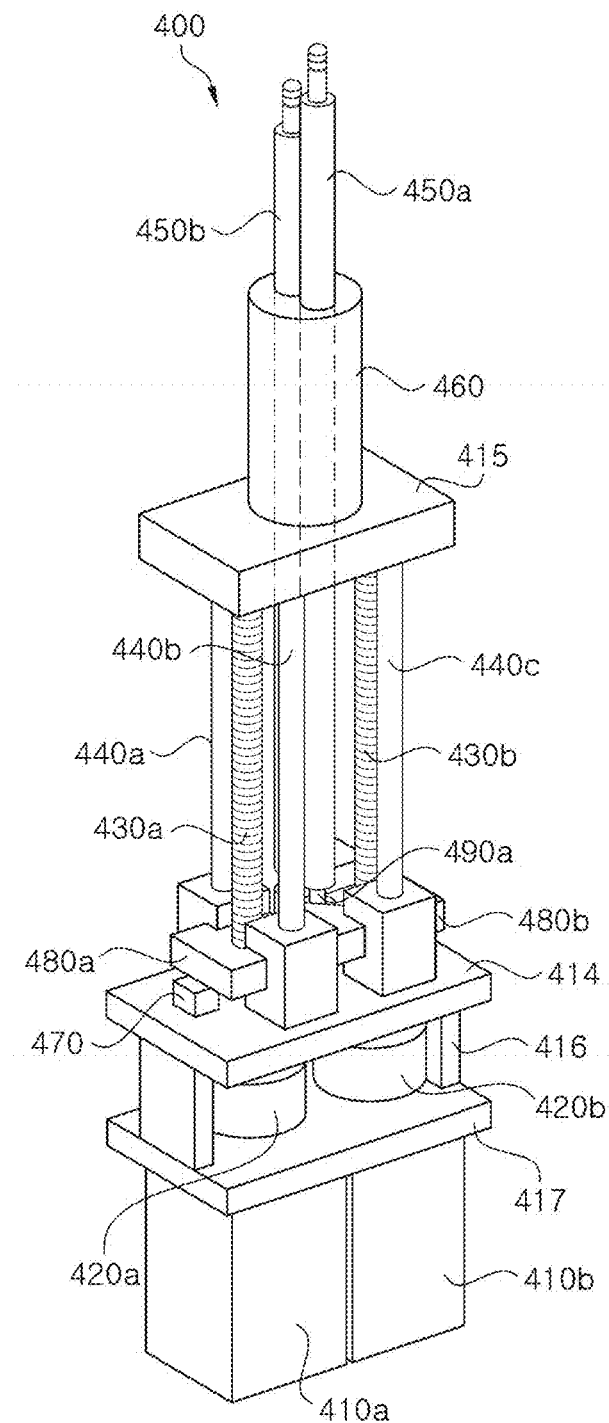
FIG. 3 is a schematic perspective view of an embodiment of a lifting driver of FIG. 2.
Figure 4:
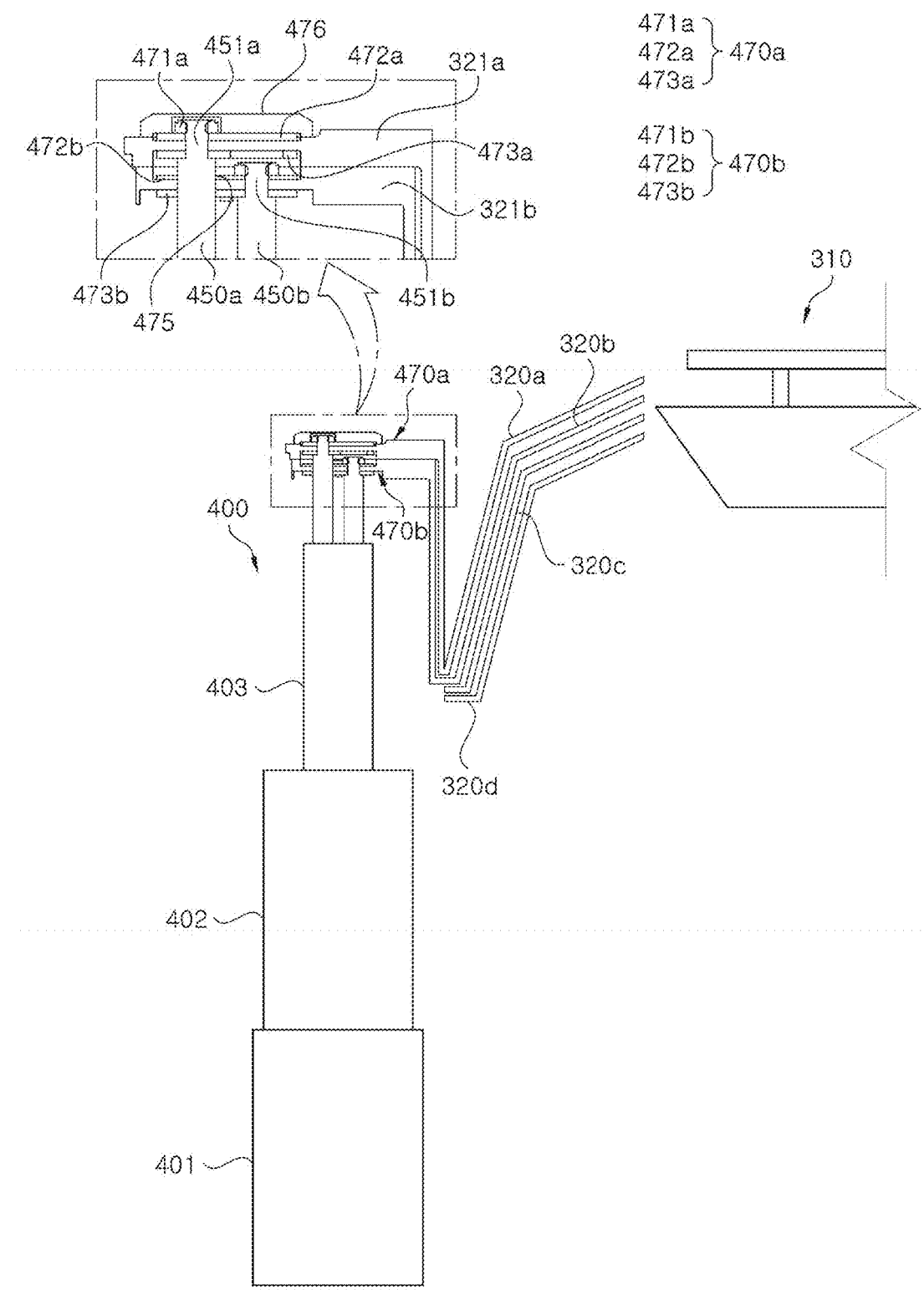
FIG. 4 is a schematic view illustrating the combination of the lifting driver and a recovery vessel of FIG. 3.
Figure 5:
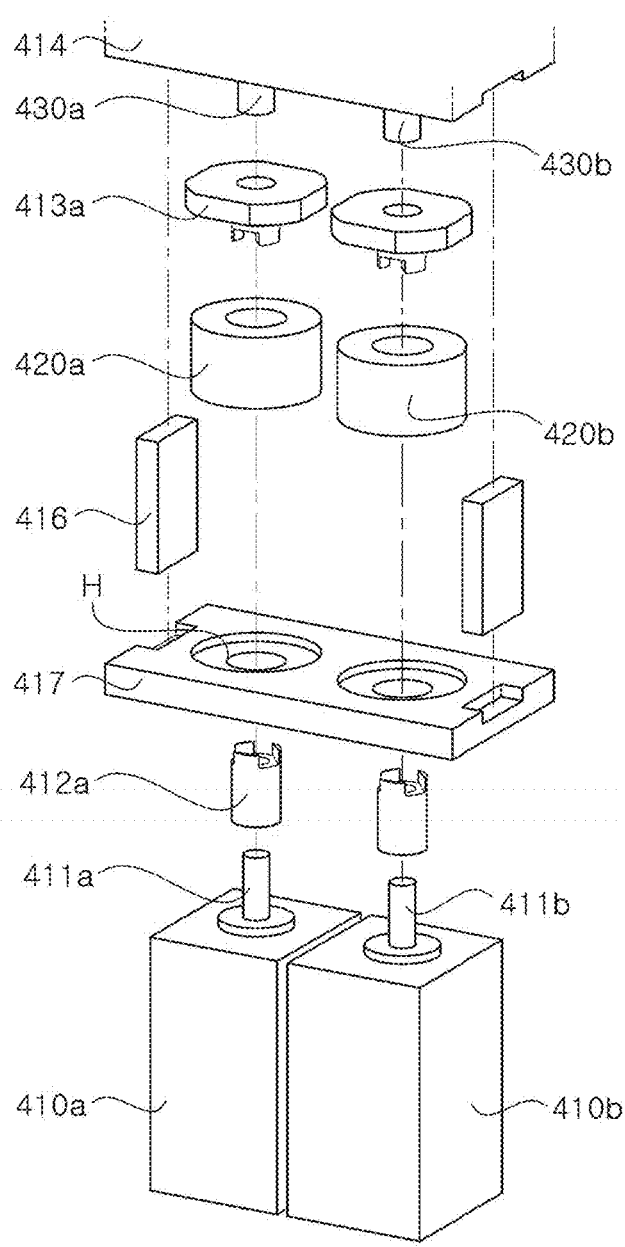
FIG. 5 is a partially exploded perspective view of the lifting driver of FIG. 3.
Figure 6:
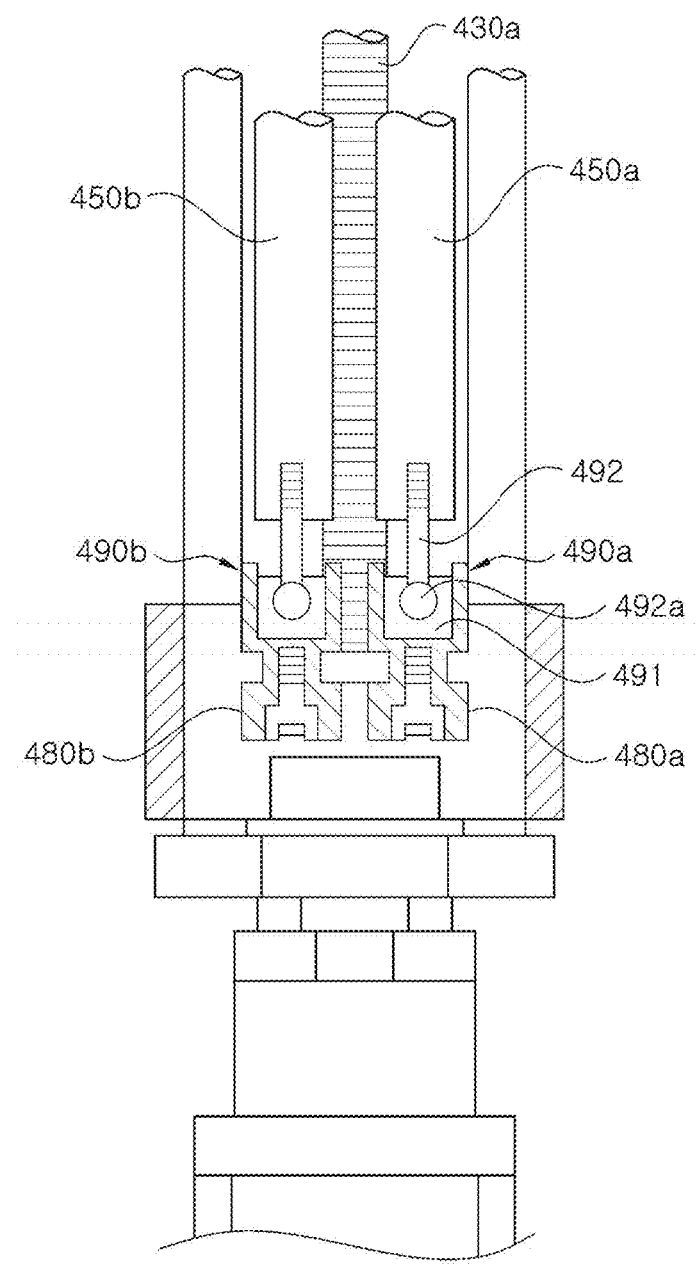
FIG. 6 is a partial cross-sectional view of the lifting driver of FIG. 3.
Figure 7:
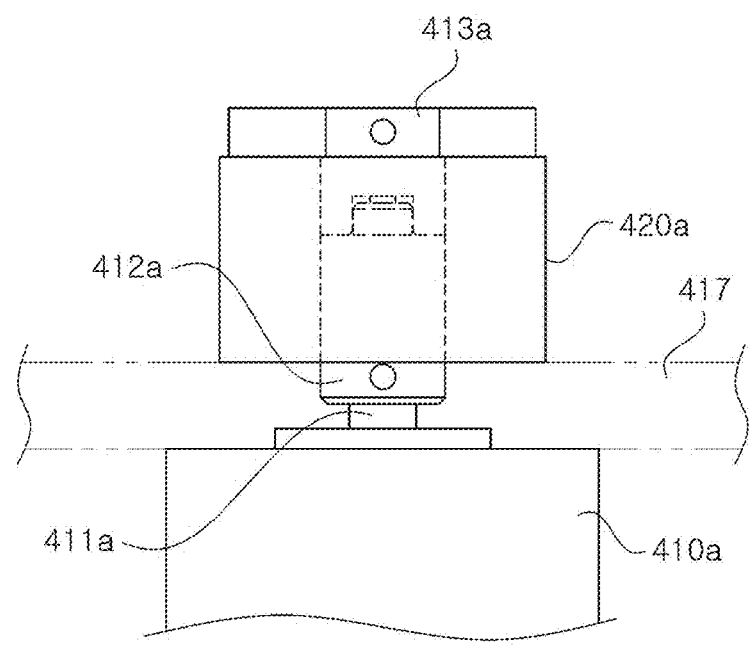
FIG. 7 is a partial schematic view of a motor and a coupling connecting portion of the lifting driver of FIG. 3.
Figure 8:
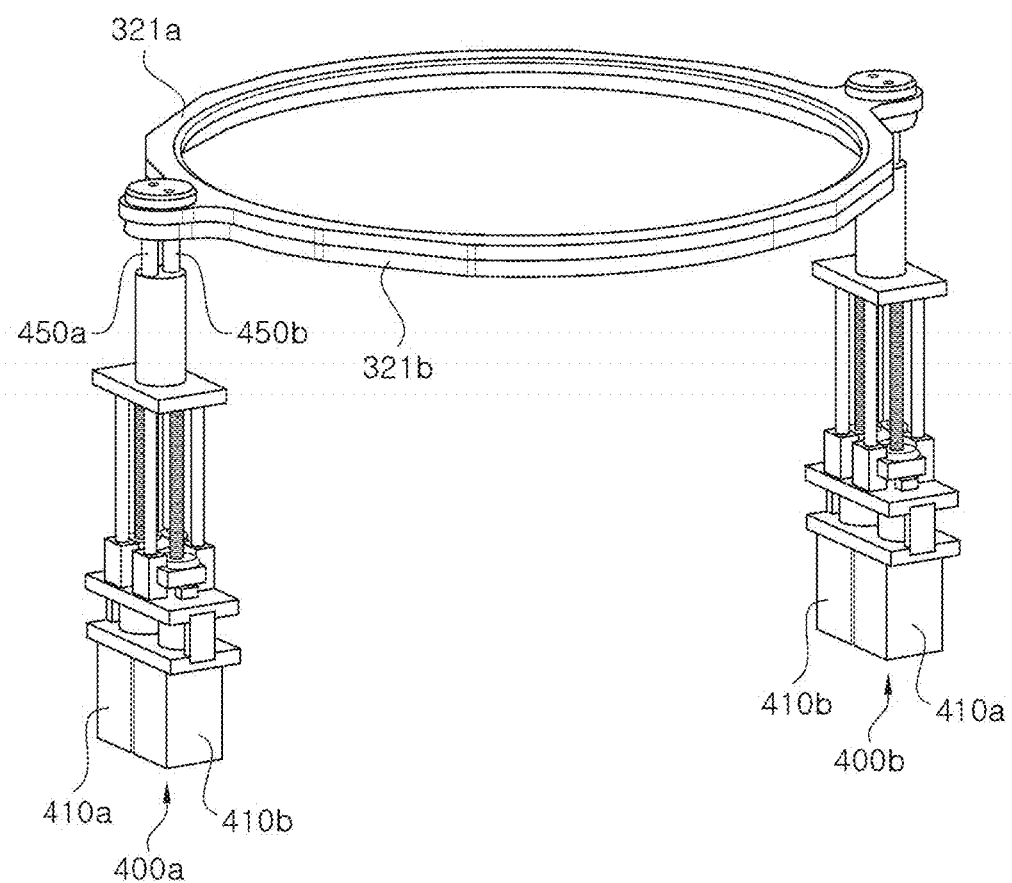
FIG. 8 is a schematic diagram of a moving assembly for a recovery guard according to an embodiment.

FIG. 3 is a schematic perspective view of an embodiment of the lifting driver of FIG. 2, FIG. 4 is a schematic diagram illustrating the coupling of the lifting driver and the recovery vessel of FIG. 3, FIG. 5 is a partially exploded perspective view of the lifting driver of FIG. 3, FIG. 6 is a partial cross-sectional view of the lifting driver of FIG. 3, FIG. 7 is a partial schematic diagram of a motor connecting portion of the lifting driver of FIG. 3, and FIG. 8 illustrates a schematic diagram of a moving assembly for a recovery guard.

Referring to FIGS. 3 to 8, a moving assembly for a recovery guard and a lifting driver 400 according to an embodiment will be described.

As described above, the moving assembly for a recovery guard is configured as two lifting drivers 400 are connected to two recovery vessels 320a-d. Since the two lifting drivers 400 have substantially the same configuration, one lifting driver 400 will be described.

The lifting driver 400 includes a power unit 401, a power conversion unit 402, and a moving unit 403, and in this embodiment, the power unit 401, the power conversion unit 402 and the moving unit 403 are continuously disposed in the vertical direction (third direction).

The power unit 401 is a part that converts an electrical signal into a rotational force and provides a driving force required for elevation, and includes a motor. The power conversion unit 402 converts the rotational force of the motor into vertical movement, and in this embodiment, the power conversion unit 402 includes a ball screw. The moving unit 403 refers to a configuration connected to the recovery vessels 320a-d and moving in a vertical direction from the power conversion unit 402.

In detail, in this embodiment, the lifting driver 400 includes first and second motors 410a and 410b disposed adjacent to each other; a first shaft 450a connected to the first motor 410a and the first recovery vessel 320a and moved in a vertical direction by driving the first motor 410a; a second shaft 450b connected to the second motor 410b and the second recovery vessel 320b and moved in the vertical direction by the driving of the second motor 410b; a first ball screw 430a connected to a drive shaft 411a of the first motor 410a; a second ball screw 430b connected to a drive shaft 411b of the second motor 410b; a first shaft driving block 480a including a through-hole through which the first ball screw 430a passes and on which a thread is formed, rotation of the first shaft driving block 480a being restricted in the direction of rotation of the first motor 410a, and the first shaft driving block 480a being connected to the first shaft 450a; a second shaft driving block 480b including a through-hole through which the second ball screw 430b passes and on which a thread is formed, rotation of the second shaft driving block 480b being constrained in the rotational direction of the second motor 410b, and the second shaft driving block 480b being connected to the second shaft 450b; a first connecting portion 470a connecting the first shaft 450a and the first recovery vessel 320a; and a second connecting portion 470b connecting the second shaft 450b and the second recovery vessel 320b.

The motors 410a and 410b include a number corresponding to the connected recovery vessels 320a-d, such that the recovery vessels 320a-d are connected to the corresponding motors 410a and 410b to move independently. Encoders are connected inside or outside the drive shafts 411a and 411b of the motors 410a and 410b to sense the rotation of the motors 410a and 410b, and the motors 410a and 410b and the encoders are connected to a controller (not illustrated), and the controller (not illustrated) may detect the amount of rotation of the motors 410a and 410b through the encoder to constantly control the ascending or descending speeds of the first lifting driver 400a and the second lifting driver 400b, and may synchronously control the plurality of lifting drivers 400a to d. The encoder may be an absolute type encoder to facilitate position tracking.

The motors 410a and 410b are fixed to the substrate processing apparatus 300 by a fixing block 417, and the fixing block 417 has a through-hole H through which the drive shafts 411a and 411b of the motors 410a and 410b pass.

The drive shafts 411a and 411b of the motors 410a and 410b and the ball screws 430a and 430b are connected by couplings 412a and 412b, 413a and 413b. The first motor 410a and the first ball screw 430a are connected by first couplings 412a and 413a, and the second motor 410b and the second ball screw 430b are connected by couplings 412b and 413b. The first and second couplings include shaft-side couplings 413a and 413b connected to the shafts 450a and 450b and motor-side couplings 412a and 412b connected to the motors 410a and 410b. As illustrated in FIG. 5, the couplings 412a, 412b, 413a, and 413b include protrusions and grooves to transfer the rotation of the drive shafts 411a and 411b to the ball screws 430a and 430b.

The lifting driver 400 further includes a first brake 420a surrounding the first couplings 412a and 413a and a second brake 420b surrounding the second couplings 412b and 413b, and the first and second brakes 420a and 420b are disposed in positions where the couplings 412a, 412b, 413a and 413b are connected, thereby preventing the raised recovery vessels 320a and 320b from descending in an emergency situation, without increasing the length thereof in the vertical direction. The brakes 420a and 420b will be described again later with reference to FIG. 7.

A first support block 414 is disposed in a position spaced apart from the fixing block 417 by a predetermined distance upward, and the fixing block 417 and the first support block 414 are connected by a connection block 416. Guides 440a, 440b, and 440c and a sensor 470 are connected to the first support block 414, and the first support block 414 has a through-hole through which the ball screws 430a and 430b and the shaft-side couplings 413a and 413b pass.

The sensor 470 may be a non-contact sensor detecting a portion of the first and second shaft driving blocks 480a and 480b with a laser sensor, or may be a contact type sensor in which a part contacts the first and second shaft driving blocks 480a and 480b at an initial position, to determine whether the first and second shaft driving blocks 480a and 480b have arrived at the initial position, which is the closest position to the motor side. The sensor 470 is connected to a controller (not illustrated) and provides information on whether the first and second shaft driving blocks 480a and 480b are in initial positions thereof. The sensor 470 includes a first sensor for detecting the position of the first shaft driving block 480a and a second sensor for detecting the position of the second shaft driving block 480b.

A second support block 415 is disposed spaced apart upwardly from the first support block 414. The guides 440a, 440b and 440c and the first and second ball screws 430a and 430b are disposed between the first and second support blocks 414 and 415, and extend in a vertical direction that is a third direction. While the first and second shaft driving blocks 480a and 480b move in the vertical direction along the first and second ball screws 430a and 430b and the guides 440a, 440b and 440c, as the first and second shafts 450a and 450b rise or fall, the first and second recovery vessels 320a and 320b are moved.

The first and second ball screws 430a and 430b are connected to the first and second motors 410a and 410b by the first and second couplings 412a, 412b, 413a and 413b, respectively. The first shaft driving block 480a is connected to the first ball screw 430a, and the second shaft driving block 480b is connected to the second ball screw 430b. The first shaft driving block 480a includes a through-hole having a screw thread corresponding to the first ball screw 430a and a guide groove through which the guides 440a and 440b pass. Since the guides 440a and 440b are LM guides that restrict movement other than vertical movement, the rotation of the first ball screw 430a raises or lowers the first shaft driving block 480a. The second shaft driving block 480b also has the same configuration as the first shaft driving block 480a.

As illustrated in a partial cross-sectional view in the center of the arrangement direction of the motors 410a and 410b in FIG. 6, the first and second shaft driving blocks 480a and 480b are configured to have different positions in a direction perpendicular to the disposition direction of the motors 410a and 410b on a plane in the center of the disposition direction of the motors 410a and 410b.

Referring to FIG. 2, if the motors 410a and 410b are disposed adjacent to each other in the tangential direction of the circumference, the first and second shaft driving blocks 480a and 480b are disposed in different positions in the radial direction, and the first shaft driving block 480a connected to the first recovery vessel 320a located relatively farther from the center line C is disposed farther from the center line C than the second shaft driving block 480b. On the other hand, the first and second shafts 450a and 450b connected to the first and second shaft driving blocks 480a and 480b are disposed at the same azimuthal angle from the central line C. For example, the first and second shafts 450a and 450b are disposed in the radial direction.

The first shaft driving block 480a is connected to the first shaft 450a by a first floating joint 490a, and the second shaft driving block 480b is connected to the second shaft 450b by a second floating joint 490b. In this embodiment, the floating joints 490a and 490b include a second part 492 coupled to the shafts 450a and 450b and a first part 491 coupled to the shaft driving blocks 480a and 480b, and the second part 492 has a spherical shape on the end, and the first part 491 has a shape to accommodate the spherical shape, thereby providing flexibility between the two linear components. For example, even if the operation of the shaft driving blocks 480a and 480b does not exactly match the vertical direction, the shafts 450a and 450b are guided by the bush 460 to accurately move in the vertical direction.

The first and second shafts 450a and 450b are connected to the first and second recovery vessels 320a and 320b through first and second connecting portions 470a and 470b. The first and second connecting portions 470a and 470b include first plates 472a and 472b having a substantially circular shape on a plane, and second plates 473a and 473b spaced apart from the first plates 472a and 472b in a vertical direction and having a shape corresponding to the first plates 472a and 472b. The first plates 472a and 472b and the second plates 473a and 473b include through-holes through which the first shaft 450a and the second shaft 450b pass, respectively. The bases 321a and 321b of the first or second recovery vessels 320a and 320b are interposed between the first and second plates 472a and 472b and the second plates 473a and 473b, and the fastening members 471a and 471b are fastened to the ends 451a and 451b of the first and second shafts 450a and 450b, and as a result, the shafts 450a and 450b are connected to the first and second recovery vessels 320a and 320b. A cover 476 covering the first connecting portion 470a is disposed on the outer side of the first connecting portion 470a.

The first and second connecting portions 470a and 470b are concentrically disposed on a plane, and the through-hole through which the shaft passes is disposed in a position spaced apart from the center of the first and second connecting portions 470a and 470b. To this end, the second connecting portion 470b further includes a through-hole 475 through which the first shaft 450a passes along with a through-hole connected to the second shaft 450b. Therefore, the lifting driver 400 according to an embodiment may drive the plurality of recovery vessels 320a-d by a pair of lifting drivers 400 located at a specific azimuth angle of the center line (C; see FIG. 2), and a space occupied by the substrate processing apparatus 300 may be significantly reduced.

In this embodiment, the brakes 420a and 420b are included, and thus, even when power is not supplied to the motors 410a and 410b, the positions of the recovery vessels 320a-d may be maintained at the set positions, and even in the case in which a failure occurs, problems due to scattering do not occur.

The brakes 420a and 420b may be selected from either an excitation brake or a non-excitation brake, and excitation brakes are used in this embodiment. Referring briefly to the operating method of the brake 420a with reference to FIG. 7, the brake 420a is fixed to the fixing block 417, and includes an elastic member that presses a portion of the brake 420a with the shaft-side coupling 413a and an electromagnet that provides electromagnetic force to move the above portion away from the shaft-side coupling 413a. When power is supplied to the brake 420a, the electromagnet therein operates to move the portion of the brake 420a away from the shaft side coupling 413a, and thus, the shaft side coupling 413a may rotate freely from the fixed brake 420a. However, when the power supply is cut off, the operation of the electromagnet is stopped, and a portion of the brake 420a comes into close contact with the shaft-side coupling 413a, and the portion and the shaft-side coupling 413a contact with the pressing force of the elastic member, preventing rotation of the shaft-side coupling 413a. Therefore, movement of the recovery vessels 320a-d may be prevented.

Figure 9:
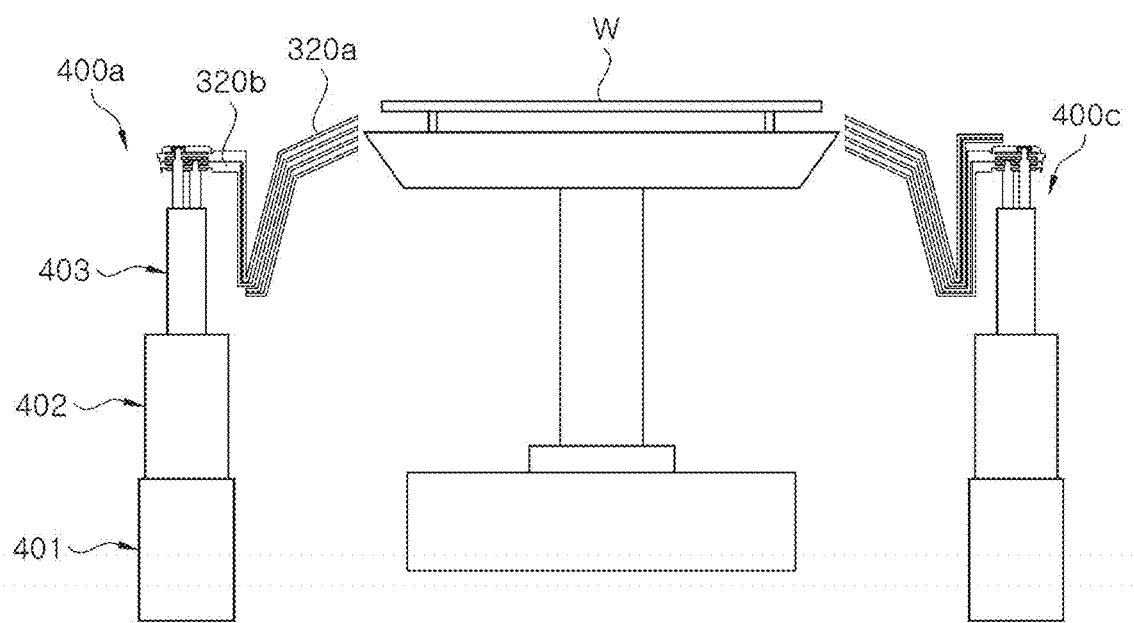
FIGS. 9 to 11 are schematic views illustrating the operation of a moving assembly for a recovery guard in a substrate processing apparatus according to the embodiment.
Figure 10:
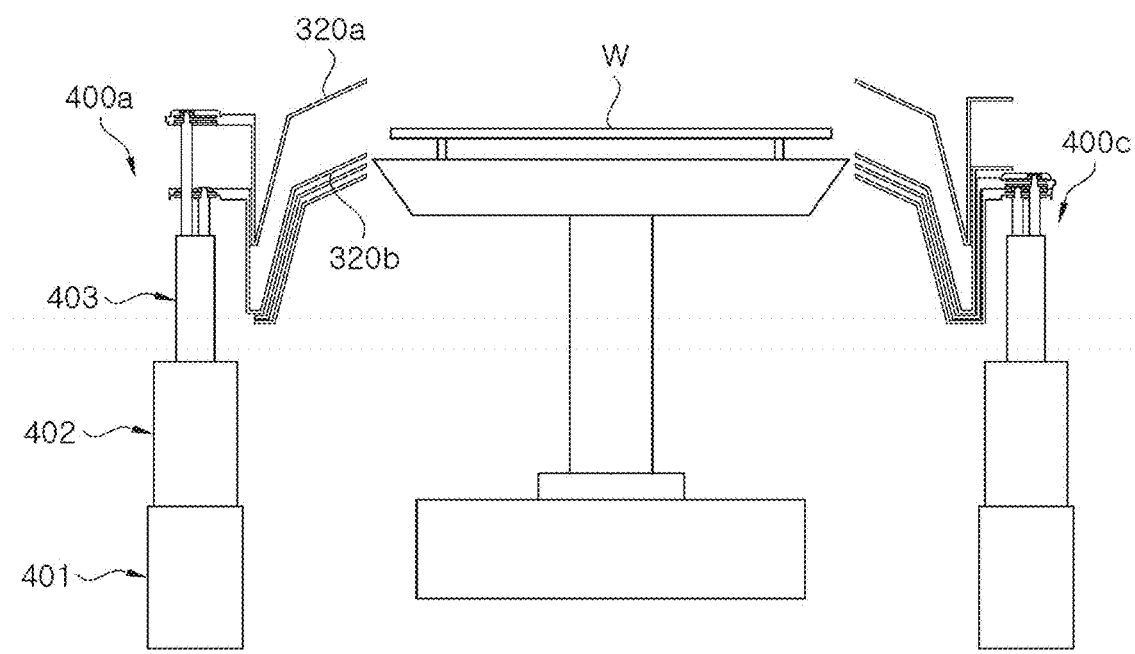
Figure 11:
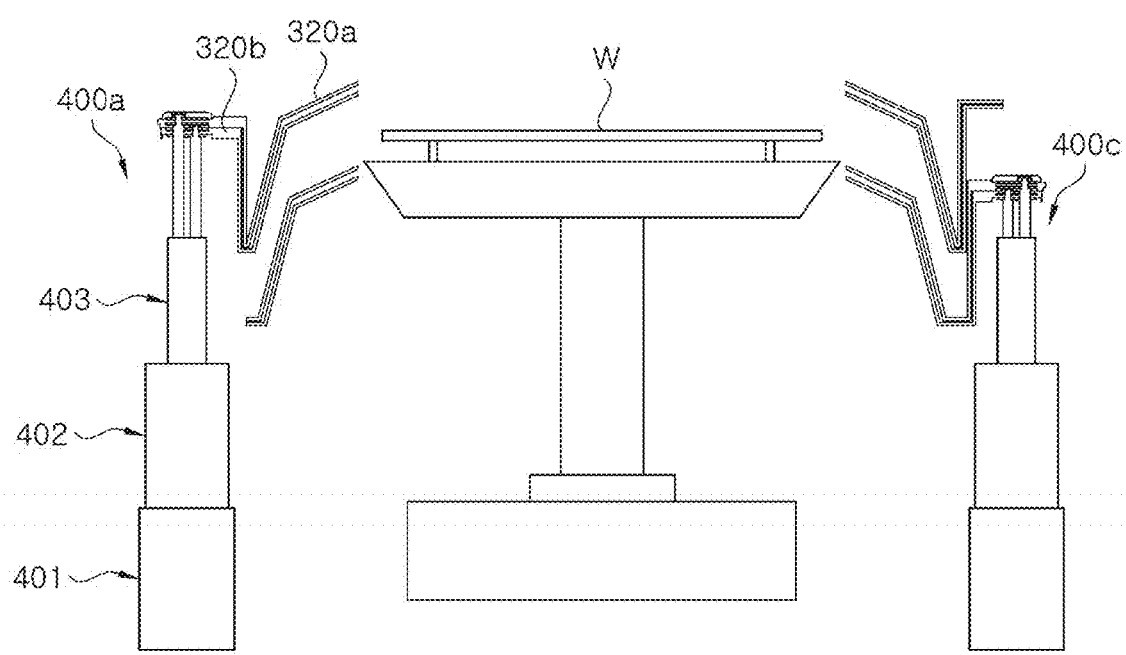

FIGS. 9 to 11 illustrate how the recovery vessel lifting assembly operates by the lifting driver 400.

In this embodiment, the lifting driver 400 includes first and second lifting drivers 400a and 400b connected to the first and second recovery vessels 320a and 320b, and third and fourth lifting drivers 400c and 400d connected to the third and fourth recovery vessels 320c and 320d. As illustrated in FIG. 2, FIGS. 9 to 11, for convenience of description, illustrate a shape in which the first lifting driver 400a and the third lifting driver 400c are coupled to the first to fourth recovery vessels 320a-d. Although not illustrated, the second lifting driver 400b is driven in the same manner as the first lifting driver 400a, and the fourth lifting driver 400d is driven in the same manner as the third lifting driver 400c.

FIG. 10 illustrates the case in which the first recovery vessel 320a is raised, and the controller (not illustrated) operates the first motors 410a of the first lifting driver 400a and the second lifting driver 400b determined to be located at the initial position by the sensor 270 (see FIG. 2). At this time, the controller monitors the rotational position of the first motors 410a with an encoder, and when a deviation in the rotational positions occurs, since a height difference may occur, the first recovery vessel may be again raised after initialization, or may be adjusted to the same position by driving only the first motor 410a on either side, and then the elevation thereof may proceed. When the first recovery vessel 320a is raised to a predetermined position by driving the first motor 410a, the operation may be terminated by stopping the driving. In the case of this embodiment, since the power unit 401 includes the motors 410a and 410b, unlike the cylinder, the distance may be adjusted, and if necessary, the raised height may be adjusted to correspond to the rotational speed of the substrate supporter 310, such that a plurality of vessels may be operated in one position similar to a cylinder while the raised height of the recovery vessel may be adjusted, and thus, it is advantageous to control the recovery vessel and secure space.

In the case of FIG. 11, the second motor 420b is driven when the second recovery vessel 320b is elevated. In addition, although not illustrated, when the third recovery vessel 320c is raised, the first motors 410a of the third and fourth lifting drivers 400c and 400d are driven. When the fourth recovery vessel 320d is raised, the second motors 410b of the third and fourth lifting drivers 400c and 400d are driven.

In the above embodiment, it has been described as having four recovery vessels 320a-d, but it is not limited thereto and it is possible to have three recovery vessels 320a to c, and the three recovery vessels 320a to c may also be connected to the first and second lifting drivers 400a and 400b, but only the two recovery vessels 320a and b are connected to the first and second lift drives 400a and 400b and one recovery vessel 320c may also be connected to the third and fourth lifting drivers 400c and 400d. In this case, the third and fourth lifting drivers 400c and 400d may include only one motor 410a and a configuration connected to the motor 410a.

Figures 12A, 12B:
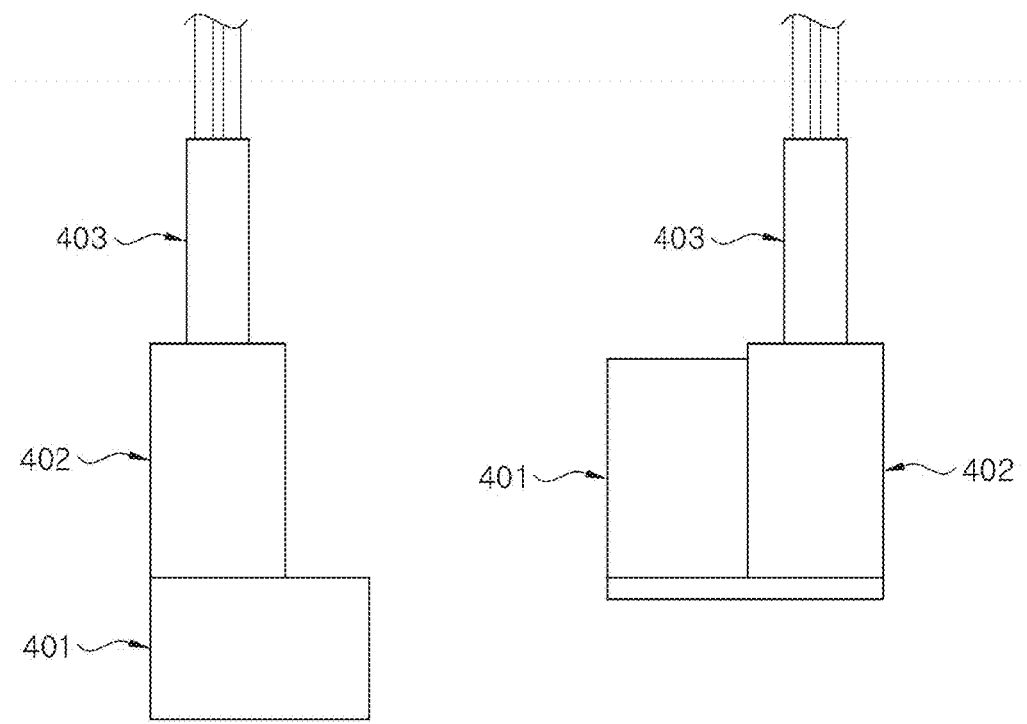
FIGS. 12A and 12B are schematic diagrams of another embodiment of a lifting driver.

FIGS. 12A and 12B illustrate another embodiment of the lifting driver 400 of the present disclosure.

In the case of the lifting driver 400 of the present disclosure, if a configuration is included to connect a plurality of motors with a plurality of shafts disposed at the same location, unless the location of the power unit 401 may not be to be directly connected to the lower part of the power conversion unit 402, as illustrated in FIG. 12A, the drive shaft of the power unit 401 may also be orthogonal to the disposition direction of the power conversion unit 402 and the moving unit 403. For example, the power unit 401 may also be disposed such that the drive shaft is disposed in a horizontal direction perpendicular to the vertical direction, which is the disposition direction of the power conversion unit 402 and the moving unit 403. In this case, since the height of the lifting driver 400 is reduced, relatively more substrate processing apparatuses 300 may be disposed in the liquid processing chamber 260. At this time, power transmission between the power unit 401 and the power conversion unit 402 may be transmitted using a known power transmission means when the two shafts are not aligned, for example, a universal joint, a bevel gear, or the like.

In addition, to secure space, the power unit 401 may be disposed on the side of the power conversion unit 402 as illustrated in FIG. 12B. In this case, since the drive shaft of the power unit 401 is parallel to the drive shaft of the power conversion unit 402, power may be transmitted through a belt, gear or the like.

As set forth above, according to an embodiment, a moving assembly for a recovery guard and a substrate processing apparatus, which may be installed in a relatively narrow space, and are easily controlled through by the above configuration, may be provided.

While example embodiments have been illustrated and described above, it will be apparent to those skilled in the art that modifications and variations could be made without departing from the scope of the present disclosure as defined by the appended claims.

What is claimed is:

1. A moving assembly for a recovery guard, comprising:
a recovery vessel, including a first recovery vessel surrounding a substrate support, and a second recovery vessel disposed inside of the first recovery vessel, concentrically with respect to the first recovery vessel; and
a lifting driver connected to the first and second recovery vessels and elevating the first and second recovery vessels,
wherein the lifting driver includes a first motor and a second motor, a first shaft connected to the first motor and the first recovery vessel and moving in a first direction by driving the first motor, a second shaft connected to the second motor and the second recovery vessel and moving in the first direction by driving the second motor, a first connecting portion connecting the first shaft and the first recovery vessel, and a second connecting portion connecting the second shaft and the second recovery vessel, and
the second connecting portion includes a passage hole through which the first shaft passes.

2. The moving assembly for a recovery guard of claim 1, wherein the lifting driver further includes a first ball screw connected to a drive shaft of the first motor, a second ball screw connected to a drive shaft of the second motor, a first shaft driving block including a through-hole, through which the first ball screw passes and on which a thread is formed, rotation of the first shaft driving block being constrained in a direction of rotation of the first motor, and the first shaft driving block being connected to the first shaft, and a second shaft driving block having a through-hole, through which the second ball screw passes and on which a thread is formed, rotation of the second shaft driving block being constrained in a direction of rotation of the second motor, and the second shaft driving block being connected to the second shaft.

3. The moving assembly for a recovery guard of claim 2, wherein the first and second motors are disposed adjacent to each other.

4. The moving assembly for a recovery guard of claim 2, wherein the first shaft driving block and the first shaft are connected by a first floating joint, and
the second shaft driving block and the second shaft are connected by a second floating joint.

5. The moving assembly for a recovery guard of claim 4, wherein the first brake and the second brake are excitation type brakes.

6. The moving assembly for a recovery guard of claim 2, wherein the first motor and the first ball screw are connected by a first coupling,
the second motor and the second ball screw are connected by a second coupling, and
the lifting driver further includes a first brake surrounding the first coupling and a second brake surrounding the second coupling.

7. The moving assembly for a recovery guard of claim 6, wherein the first and second motors and the first and second brakes are connected to a fixing block,
the first coupling includes a screw-side coupling connected to the first ball screw, and
the first brake is in contact with the screw-side coupling according to a signal to stop rotation of the screw-side coupling.

8. The moving assembly for a recovery guard of claim 1, wherein the lifting driver includes a first lifting driver disposed on one side of the first and second recovery vessels and a second lifting driver; and
the first motor and the second motor of the first and second lifting drivers are provided with encoders such that the first and second lifting drivers are synchronously controlled.

9. The moving assembly for a recovery guard of claim 1, wherein the first connecting portion and the second connecting portion are disposed concentrically in the first direction when viewed from the first direction, and
the first shaft is connected to a position spaced apart from a center of the first connecting portion, and the second shaft is connected to a position spaced apart from a center of the second connecting portion.

10. The moving assembly for a recovery guard of claim 1, wherein rotation axes of the first and second motors are perpendicular to the first direction.

11. A moving assembly for a recovery guard, comprising:
a recovery vessel including a first recovery vessel surrounding a substrate support and a second recovery vessel disposed inside of the first recovery vessel and being coaxial to the first recovery vessel; and
a lifting driver connected to the first and second recovery vessels and elevating the first and second recovery vessels,
wherein the lifting driver includes a first motor and a second motor disposed adjacent to each other, a first shaft connected to the first motor and the first recovery vessel and moving in a first direction by driving the first motor, a second shaft connected to the second motor and the second recovery vessel and moving in the first direction by driving the second motor, a first connecting portion connecting the first shaft and the first recovery vessel, and a second connecting portion connecting the second shaft and the second recovery vessel, and
the lifting driver includes a first lifting driver disposed on one side of the first and second recovery vessels and a second lifting driver.

12. The moving assembly for a recovery guard of claim 11, wherein the first motor and the second motor of the first lifting driver and the first motor and the second motor of the second lifting driver are provided with encoders installed such that the first and second lifting drivers are synchronously controlled.

13. The moving assembly for a recovery guard of claim 12, wherein the first and second lifting drivers further include a first ball screw connected to a drive shaft of the first motor, a second ball screw connected to a drive shaft of the second motor, a first shaft driving block including a through-hole, through which the first ball screw passes and on which a thread is formed, rotation of the first shaft driving block being constrained in a direction of rotation of the first motor, and the first shaft driving block being connected to the first shaft, and a second shaft driving block including a through-hole, through which the second ball screw passes and on which a thread is formed, rotation of the second shaft driving block being constrained in a direction of rotation of the second motor, and the second shaft driving block being connected to the second shaft.

14. The moving assembly for a recovery guard of claim 13, wherein the first and second lifting drivers include a guide restricting rotation of the first and second shaft driving blocks, and
a fixing block to which the guide is fixed,
wherein the fixing block is provided with a first sensor detecting a position of the first shaft driving block closest to a first motor side and a second sensor detecting a position of the second shaft driving block closest to a second motor side.

15. The moving assembly for a recovery guard of claim 14, wherein the first and second lifting drivers include a first floating joint connecting the first shaft driving block and the first shaft and a second floating joint connecting the second shaft driving block and the second shaft.

16. The moving assembly for a recovery guard of claim 15, wherein the first and second floating joints include a first part coupled to a shaft driving block and a second part coupled to the shaft,
wherein the second part has a spherical shape on an end, and the first part has a shape to accommodate the spherical shape.

17. A substrate processing apparatus comprising:
a substrate support rotating while supporting a substrate;
a treatment liquid supply unit supplying a treatment liquid to the substrate; and
a moving assembly for a recovery guard, including a recovery vessel recovering the treatment liquid scattered from the substrate, and a lifting driver connected to the recovery vessel and elevating the recovery vessel,
wherein the recovery vessel includes a first recovery vessel surrounding the substrate support, a second recovery vessel disposed inside of the first recovery vessel concentrically with respect to the first recovery vessel, a third recovery vessel disposed inside of the second recovery vessel concentrically with respect to the first recovery vessel, and a fourth recovery vessel disposed inside of the third recovery vessel concentrically with respect to the first recovery vessel, the lifting driver includes a first lifting driver connected to the first and second recovery vessels, a second lifting driver and connected to the first and second recovery vessels, a third lifting driver connected to the third and fourth recovery vessels, and a fourth lifting driver and connected to the third and fourth recovery vessels, and the first to fourth lifting drivers respectively include first and second motors disposed adjacently to each other, a first shaft connected to the first motor and the first recovery vessel and moving in a first direction by driving the first motor, a second shaft connected to the second motor and the second recovery vessel and moving in the first direction by driving the second motor, a first connecting portion connecting the first shaft and the first recovery vessel, and a second connecting portion connecting the second shaft and the second recovery vessel.

18. The substrate processing apparatus of claim 17, wherein a pair of lifting drivers disposed on symmetrical positions, among the first to fourth lifting drivers, respective include a first ball screw connected to a drive shaft of the first motor, a second ball screw connected to a drive shaft of the second motor, a first shaft driving block including a through-hole, through which the first ball screw passes and on which a thread is formed, the first shaft driving block being rotationally constrained in a rotational direction of the first motor and connected to the first shaft, and a second shaft driving block including a through-hole, through which the second ball screw passes and on which a thread is formed, the second shaft driving block being rotationally constrained in a rotational direction of the second motor and connected to the second shaft.

19. The substrate processing apparatus of claim 18, wherein the first motor and the first ball screw are connected by a first coupling, the second motor and the second ball screw are connected by a second coupling, and the first to fourth lifting drivers further include a first brake surrounding the first coupling and a second brake surrounding the second coupling.

20. The substrate processing apparatus of claim 17, further comprising a controller connected to the first and second motors of the first to fourth lifting drivers, wherein the controller synchronously controls the first and second motors in positions symmetrical to each other.

* * * * *